United States Patent
Oprescu

(10) Patent No.: US 7,164,378 B2
(45) Date of Patent: *Jan. 16, 2007

(54) ANALOG-TO-DIGITAL CONVERTER WITH REDUCED AVERAGE INPUT CURRENT AND REDUCED AVERAGE REFERENCE CURRENT

(75) Inventor: Florin A Oprescu, Rancho Santa Fe, CA (US)

(73) Assignee: Linear Technology Corp., Milpitas, CA (US)

( * ) Notice: Subject to any disclaimer, the term of this patent is extended or adjusted under 35 U.S.C. 154(b) by 71 days.

This patent is subject to a terminal disclaimer.

(21) Appl. No.: 11/252,388

(22) Filed: Oct. 17, 2005

(65) Prior Publication Data

US 2006/0082486 A1    Apr. 20, 2006

Related U.S. Application Data

(60) Provisional application No. 60/619,007, filed on Oct. 18, 2004.

(51) Int. Cl.
  *H03M 1/12* (2006.01)
(52) U.S. Cl. .................. 341/155; 341/143
(58) Field of Classification Search ........... 341/155, 341/161, 122, 143, 172
  See application file for complete search history.

(56) References Cited

U.S. PATENT DOCUMENTS

| | | | | |
|---|---|---|---|---|
| 5,017,920 A | * | 5/1991 | French | 341/163 |
| 5,107,266 A | * | 4/1992 | Kim | 341/163 |
| 5,200,752 A | * | 4/1993 | Goeke | 341/168 |
| 5,610,557 A | | 3/1997 | Jett, Jr. | |
| 6,140,950 A | | 10/2000 | Oprescu | |
| 6,169,506 B1 | | 1/2001 | Oprescu et al. | |
| 6,411,242 B1 | | 6/2002 | Oprescu et al. | |
| 6,639,526 B1 | | 10/2003 | Mayes | |
| 6,741,192 B1 | * | 5/2004 | Murata et al. | 341/100 |
| 6,744,394 B1 | | 6/2004 | Liu et al. | 341/155 |
| 6,762,707 B1 | * | 7/2004 | Wolf et al. | 341/155 |
| 6,891,490 B1 | * | 5/2005 | Hales | 341/155 |
| 6,927,717 B1 | | 8/2005 | Oprescu | |
| 2004/0001018 A1 | | 1/2004 | Hales | |

OTHER PUBLICATIONS

"24-Bit No Latency ΔΣ™ ADC with Differential Input and Differential Reference," LTC2410 Data Sheet, Linear Technology Corporation, 2000, no month.
"24-Bit High Speed 4-Channel ΔΣ ADC with Integrated Amplifier," LTC2442 Data Sheet, Linear Technology Corporation, 2005, no month.

* cited by examiner

*Primary Examiner*—Peguy JeanPierre
(74) *Attorney, Agent, or Firm*—Fish & Neave IP Group of Ropes & Gray LLP

(57) ABSTRACT

Novel system and methodology for sampling analog input signals to reduce an average common-mode input current caused by unbalanced nodes of an input signal source. An analog-to-digital (A/D) conversion system for converting an analog input signal supplied by a signal source having first and second nodes may have a first sampling circuit coupled to the first node for sampling the input signal with respect to a reference signal and configured so as to provide a substantially zero total charge taken from the first node during a first sampling process, and a second sampling circuit coupled to the second node for sampling the input signal with respect to the reference signal and configured so as to provide a substantially zero total charge taken from the second node during a second sampling process. In response to first and second output signals respectively produced by the first and second sampling circuits, an output circuit may provide common-mode rejection.

32 Claims, 6 Drawing Sheets

ANALOG-TO-DIGITAL CONVERTER WITH REDUCED AVERAGE INPUT CURRENT AND REDUCED AVERAGE REFERENCE CURRENT

RELATED APPLICATIONS

This application claims priority of U.S. provisional application No. 60/619,007 filed on Oct. 18, 2004, entitled "SAMPLING CONFIGURATION WITH REDUCED AVERAGE INPUT CURRENT," and incorporated herein by reference.

U.S. patent application Ser. No. 11/252,387, filed on Oct. 17, 2005, entitled "ANALOG SIGNAL SAMPLING SYSTEM AND METHOD HAVING REDUCED AVERAGE INPUT CURRENT" and incorporated herewith by reference.

U.S. patent application Ser. No. 11/253,082, filed on Oct. 17, 2005, entitled "ANALOG SIGNAL SAMPLING SYSTEM AND METHOD HAVING REDUCED AVERAGE DIFFERENTIAL INPUT CURRENT" and incorporated herewith by reference.

BACKGROUND OF THE INVENTION

1. Technical Field

This disclosure relates to analog-to-digital converters, and more particularly, to circuitry and methodology for sampling an analog input signal with reduced average input current during an analog-to-digital conversion process. Furthermore this disclosure relates to circuitry and methodology for sampling an analog input signal with reduced average input current and reference current during an analog-to-digital conversion process.

2. Background Art

A typical analog-to-digital converter samples an analog input signal in order to convert it into a corresponding digital signal. During this process, the converter loads the input signal and modifies it depending upon the impedance of the signal source. Such a modification directly influences the accuracy of the conversion process and the final result. For slower-speed and lower-resolution converters, errors caused by the input signal modification are insignificant and may be safely ignored.

On the other hand, recent developments in sensor technology, improvements in converter resolution and converter speed have made such errors significant factors limiting further increase in conversion accuracy. Moreover, the tendency to reduce power consumption and the expansion of portable applications has spread the use of a variety of sensors with relatively high source impedances. Examples of such sensors are high-value resistive bridges used to monitor weight and pressure.

At the same time, the development of over-sampling converter technology has pushed resolution of analog-to-digital conversion to a 24-bit level and higher. Typical over-sampling converters use switched-capacitor front end circuits including one or more sampling capacitors to sample an analog input signal multiple times for each conversion cycle. During each sampling process, a certain amount of charge is transferred between the signal source and the converter front end capacitors resulting in an equivalent input current flow. As this input current passes through the signal source impedance it causes a voltage change, modifying the original input value and creating a sampling error.

The value of the input current is directly proportional to the size of the sampling capacitors and to the sampling rate. Due to thermal noise limitations an increase in the conversion resolution requires a substantial increase in the size of the sampling capacitors resulting in the corresponding increase in the input current. At the same time, any increase in the overall conversion rate causes a proportional increase in the input signal sampling rate, resulting in proportional increased input current.

Two different strategies are typically used to deal with this problem. The first approach is to guarantee the complete settling (within the accuracy of the converter) of the front end sampling circuit including the input signal source impedance. This is a very difficult goal to achieve and it rapidly becomes impractical as the desired conversion accuracy and speed increase. The source impedance of a sensor imposes a theoretical limit on available ranges of conversion speed and resolution. Unavoidable parasitic capacitors and necessary signal filter capacitors involved in practical configurations further limit these ranges. An example of this approach is the LTC® 2410 analog-to-digital converter developed by Linear Technology Corporation, assignee of the present subject matter.

The second approach uses isolation buffers and amplifiers interposed between the sensor and the converter. Such buffers can be external to the converter or may be integrated within the converter front end sampling circuits. Configurations using external buffers offer great flexibility but place an unacceptable heavy burden upon the user in order to maintain the global accuracy of the measurement chain. These configurations also demand supplemental power supply rails, critical power supply sequencing circuits and additional physical space. Integrating the buffers within the converter front end sampling circuits partially resolves these issues. Nevertheless, the integrated buffers limit the analog-to-digital converter overall accuracy and dynamic range. An example of this approach is the LTC® 2442 analog-to-digital converter developed by Linear Technology Corporation, assignee of the present subject matter.

Furthermore, in many practical applications the analog-to-digital converter reference signals are also generated by relatively high source impedance sensors utilized in ratiometric fashion. Current taken by the analog-to-digital converter from the reference source during the conversion process passes through this source impedance creating a conversion error. Traditionally this problem has been resolved by using external reference buffer circuits or by limiting the reference signal source impedance. The first approach severely limits the conversion result accuracy and repeatability while the second places unreasonable restrictions upon the analog-to-digital converter range of applications.

Therefore, there is a need for a new sampling technique to reduce an average input current and an average reference current caused by the charge taken from an input signal source and a reference signal source during an analog-to-digital conversion process. A copending application No. 11/253,082, filed on Oct. 17, 2005, entitled "SYSTEM AND METHOD FOR SAMPLING ANALOG INPUT SIGNAL TO REDUCE AVERAGE DIFFERENTIAL INPUT CURRENT" and incorporated herewith by reference, discloses a differential front-end sampling circuit that reduces an average differential input current. However, the differential sampling circuit is not able to substantially reduce an average common-mode input current which may create uncompensated conversion errors through unbalanced source resistance present at two nodes of the input signal source.

As the average common mode input current significantly influences the accuracy of an analog-to-digital conversion system, it would be desirable to provide a sampling arrangement for reducing the average input current. Furthermore it is highly desirable to provide a sampling arrangement for reducing the average reference current.

SUMMARY OF THE DISCLOSURE

The present disclosure offers novel system and methodology for sampling an analog input signal to reduce an average input current and average reference current. In accordance with one aspect of the disclosure, an analog-to-digital (A/D) conversion system for converting an analog input signal supplied by a signal source having first and second nodes comprises a first sampling circuit coupled to the first node for sampling the input signal with respect to a reference signal and configured so as to provide a substantially zero total charge taken from the first node during a first sampling process, and a second sampling circuit coupled to the second node for sampling the input signal with respect to the reference signal and configured so as to provide a substantially zero total charge taken from the second node during a second sampling process.

In response to first and second output signals respectively produced by the first and second sampling circuits, an output circuit may provide differential analog-to-digital conversion result. In particular, the output circuit may combine the first and second output signals and perform digital filtering.

In accordance with an embodiment of the disclosure, the output circuit may comprise a counter for modifying a count when the first and second digital output signals have different values. The count may remain unmodified when the first and second digital output signals have the same value.

For example, the counter may be incremented when the first output signal has a first value and the second output signal has a second value, and may be decremented when the first output signal has the second value and the second output signal has the first value.

In accordance with another aspect of the disclosure, the first sampling circuit may comprise a first sampling device responsive to a first input voltage and the reference signal for providing corresponding charges during the first sampling process to produce the first output signal. A first switching circuit may be provided to supply the first input voltage and the reference signal to the sampling device. The first switching circuit may be controlled in accordance with the first output signal to supply the first input voltage and the reference signal to the sampling device so as provide a substantially zero total charge taken by the sampling device from the first node during the first sampling process.

The second sampling circuit may comprise a second sampling of device responsive to a second input voltage and the reference signal for providing corresponding charges during the second sampling process to produce the second output signal. A second switching circuit may be provided to supply the second input voltage and the reference signal to the second sampling device. The second switching circuit may be controlled in accordance with the second output signal to supply the second input voltage and the reference signal to the second sampling device so as provide a substantially zero total charge taken by the sampling device from the second node during the second sampling process.

In accordance with a method of the disclosure, the following steps are carried out to sample an input analog signal supplied from a signal source having first and second nodes:

sampling a first input signal supplied from the first node to produce a first output signal, the first input signal being sampled with respect to a reference signal so as to provide a substantially zero total charge taken from the first node, and sampling a second input signal supplied from the second node to produce a second output signal, the second input signal being sampled with respect to the reference signal so as to provide a substantially zero total charge taken from the second node.

The step of sampling the first input signal may include:
determining a number $N_1$ of sample sequences, in which a first reference signal should be supplied, among N sample sequences provided during the sampling of the first input signal,
supplying the first input signal and the first reference signal in the $N_1$ sample sequences, and
supplying the first input signal and a second reference signal in $(N-N_1)$ sample sequences.

The step of sampling the second input signal may include:
determining a number $M_1$ of sample sequences, in which a first reference signal should be supplied, among M sample sequences provided during the sampling of the second input signal,
supplying the second input signal and the first reference signal in the $M_1$ sample sequences, and
supplying the second input signal and a second reference signal in $(M-M_1)$ sample sequences.

The first output signal may have a first value for $N_1$ sample sequences, and a second value for the $(N-N_1)$ sample sequences. Similarly, the second output signal may have a first value for $M_1$ sample sequences, and a second value for $(M-M_1)$ sample sequences.

In accordance with one aspect of the disclosure, a sampling system includes a first sampling circuit coupled to a first reference signal node for sampling a first reference signal with respect to a local signal so as to provide a substantially zero total charge taken from the first reference signal node, and a second sampling circuit coupled to a second reference signal node for sampling a second reference signal with respect to the local signal so as to provide a substantially zero total charge taken from the second reference signal node.

The system may further includes a first output circuit responsive to first and second output signals respectively produced by the first and second sampling circuits for evaluating a differential reference signal defined by the first and second reference signals, with respect to the local signal. The first output circuit may perform digital combining and filtering.

In addition, the system may include a third sampling circuit coupled to a first input signal node for sampling a first input signal with respect to the local signal so as to provide a substantially zero total charge taken from the first input signal node, and a fourth sampling circuit coupled to a second input signal node for sampling a second input signal with respect to the local signal so as to provide a substantially zero total charge taken from the second input signal node. In response to third and fourth output signals respectively produced by the third and fourth sampling circuits, a second output circuit may evaluate a differential input signal defined by the first and second input signals, with respect to the local signal. The second output circuit may perform digital combining and filtering.

A third output circuit may be provided for processing output signals of the first and second output circuits to produce an output signal of the system. The third output circuit may determine a ratio between the differential input signal and the differential reference signal. For example, the third output circuit may include a divider.

The first to fourth sampling circuits and the first to third output circuits may be synchronized to achieve maximum common-mode rejection.

In accordance with an embodiment of the disclosure, the local signal may be defined by first and second local signals. The first local signal may be a signal which does not exceed the minimum signal among the input and reference signals supplied to the system, whereas the second local signal may be not less that the maximum signal among the input and reference signals supplied to the system.

For example, the first sampling circuit may comprise a first sampling device responsive to a first reference signal and the local signal for providing corresponding charges to produce the first output signal, and a first switching circuit controllable to supply the first reference signal and the local signal to the sampling device. The first switching circuit may be controlled in accordance with the first output signal to supply the first reference signal and the local signal to the sampling device so as provide a substantially zero total charge taken by the sampling device from the first reference signal node.

The other sampling circuits may contain similar elements for handling the respective reference or input signal being sampled with respect to the local signal.

In accordance with a method of the present disclosure, the following steps may be carried out to sample an input signal using a reference signal:

sampling the reference signal with respect to a local signal so as to provide a substantially zero total charge taken from a source of the reference signal, and sampling the input signal with respect to the local signal so as to provide a substantially zero total charge taken from a source of the input signal.

In accordance with another aspect of the disclosure, a sampling system for converting an input signal using a reference signal includes a reference sampling arrangement for sampling the reference signal with respect to a local signal, and an input sampling arrangement for sampling the input signal with respect to the local signal.

The reference sampling arrangement may be configured for providing a substantially zero total charge taken from a source of the reference signal, whereas the input sampling arrangement may be configured for providing a substantially zero total charge taken from a source of the input signal.

In accordance with an embodiment of the disclosure, the reference sampling arrangement may comprise a reference sampling device responsive to the reference signal and the local signal for providing corresponding charges to produce a first output signal, and a reference switching circuit controllable to supply the reference signal and the local signal to the reference sampling device. The reference switching circuit may be controlled in accordance with the first output signal to supply the reference signal and the local signal to the reference sampling device so as provide a substantially zero total charge taken by the reference sampling device from the source of the reference signal.

Similarly, the input sampling arrangement may comprise an input sampling device responsive to the input signal and the local signal for providing corresponding charges to produce a second output signal, and an input switching circuit controllable to supply the input signal and the local signal to the input sampling device. The input switching circuit may be controlled in accordance with the second output signal to supply the input signal and the local signal to the input sampling device so as provide a substantially zero total charge taken by the input sampling device from the source of the input signal.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made with the example of an over-sampling analog-to-digital (A/D) converter. It will become apparent, however, that the concepts described herein are applicable to any type of converter that uses sampling of analog signals.

Figure 1:
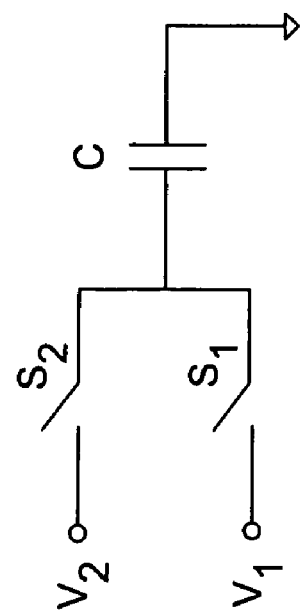
FIG. 1 is a diagram that illustrates the charge taken from an input signal source in a sample operation of the present disclosure

The instantaneous charge required from an input signal source in any single sampling operation is proportional to the size of the sampling capacitors as well as to the amount of charge stored in these capacitors prior to the sampling operation. For example, as shown in FIG. 1, one node of a sampling capacitor C is connected to a reference voltage, for example, to ground. The second node may be supplied through a switch $S_1$ with a voltage $V_1$ or through a switch $S_2$ with a voltage $V_2$. The voltages $V_1$ and $V_2$ are defined with respect to the established ground level.

Assuming that initially the switch $S_1$ is closed and the switch $S_2$ is open the charge $Q_1$ stored in the sampling capacitor C is:

$$Q_1 = V_1 * C.$$

In the second phase, the switch $S_1$ is open and subsequently the switch $S_2$ is closed. At the end of this process the sampling capacitor C will have an accumulated charge $Q_2$:

$$Q_2 = V_2 * C.$$

During this sampling operation, the signal source $V_2$ provides a charge amount dQ which can be calculated as:

$$dQ = Q_2 - Q_1 = (V_2 - V_1) * C.$$

Figure 2:
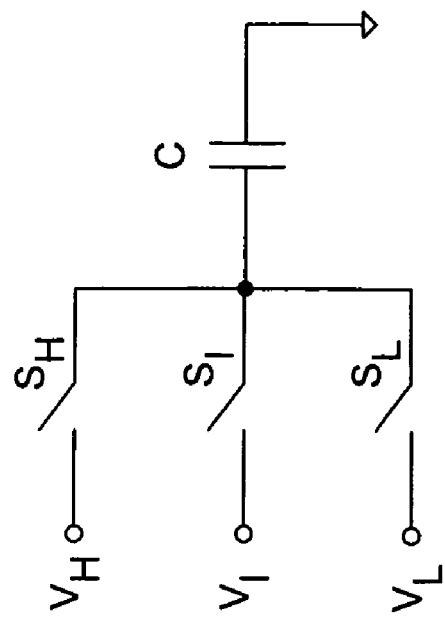
FIG. 2 is a diagram illustrating sampling of an input signal and a pair of reference signals in accordance with the present disclosure.

In another example, illustrated in FIG. 2, the sampling capacitor C has a first node connected to ground, and a second node supplied with an input voltage $V_I$ through the switch $S_I$, with a first reference voltage $V_L$ through the switch $S_L$, and with a second reference voltage $V_H$ through the switch $S_H$. At any given time only one of the three switches $S_L$, $S_I$ and $S_H$ is closed, while the remaining two are open.

A first sampling sequence of the input voltage $V_I$ starts with the switch $S_L$ closed in the first phase and continues with the switch $S_I$ closed in the second phase. The amount of charge $dQ_L$ taken from the input signal $V_I$ is:

$$dQ_L = (V_I - V_L) * C.$$

A second sampling sequence of the input voltage $V_I$ starts with the switch $S_H$ closed in the first phase and continues with the switch $S_I$ closed in the second phase. The amount of charge $dQ_H$ taken from the input signal $V_I$ in the second sampling sequence is:

$$dQ_H = (V_I - V_H) * C.$$

It may be assumed that in a set of N consecutive sample sequences of the input signal $V_I$, $N_1$ sample sequences are of a first type and the remaining $N_0 = (N - N_1)$ sample sequences are of a second type. In particular, the first type of the sample sequences may be associated with supplying the reference voltage $V_H$, together with the input signal $V_I$, and the second type may be associated with supplying the reference voltage $V_L$, together with the input signal $V_I$. This result is independent of the order and succession of the two types of sample sequences within the set N. Therefore, the total charge $dQ_N$ taken from the input signal source $V_I$ during these N consecutive sample sequences is:

$$dQ_N = N_1 * (V_I - V_H) * C + No * (V_I - V_L) * C$$

$$dQ_N = N_1 * (V_I - V_H) * C + (N - N_1) * (V_I - V_L) * C$$

$$dQ_N = N * (V_I - V_L) * C - N_1 * (V_H - V_L) * C$$

If the following condition is imposed:

$$V_H \geq V_I \geq V_L \quad (1)$$

than $N_1$ can be selected as the digital representation of the input signal $V_I$ with respect to the reference signal $V_H - V_L$ with a resolution of N counts. This relation can be written as:

$$N_1 = N * (V_I - V_L) / (V_H - V_L) \quad (2)$$

Using this value of $N_1$ in the above calculation of $dQ_N$ we obtain:

$$dQ_N = 0.$$

This result is independent of the order and succession of the two types of sample sequences within the set N.

The accuracy of this relation is limited by the quantization accuracy of the input signal $V_I$ with respect to the reference signal $V_H - V_I$ within an N counts representation. Thus, while systems and methods according to the invention reduce the current drawn from the analog signal source to substantially zero, nevertheless, some current is drawn from the analog signal source. The amount of current drawn from the analog signal source is preferably within the limits set by the quantization accuracy of the input signal.

It has been shown that, within the limitations of (1) and using prior or concomitant knowledge of the magnitude of $V_I$ with respect to $V_H$ and $V_L$ as expressed by (2), the proposed strategy reduces significantly the average charge required from the input signal source. This reduction is proportional with the resolution of the digital representation of the input signal (2) and it is particularly useful in high resolution analog-to-digital converters.

Figure 3A:
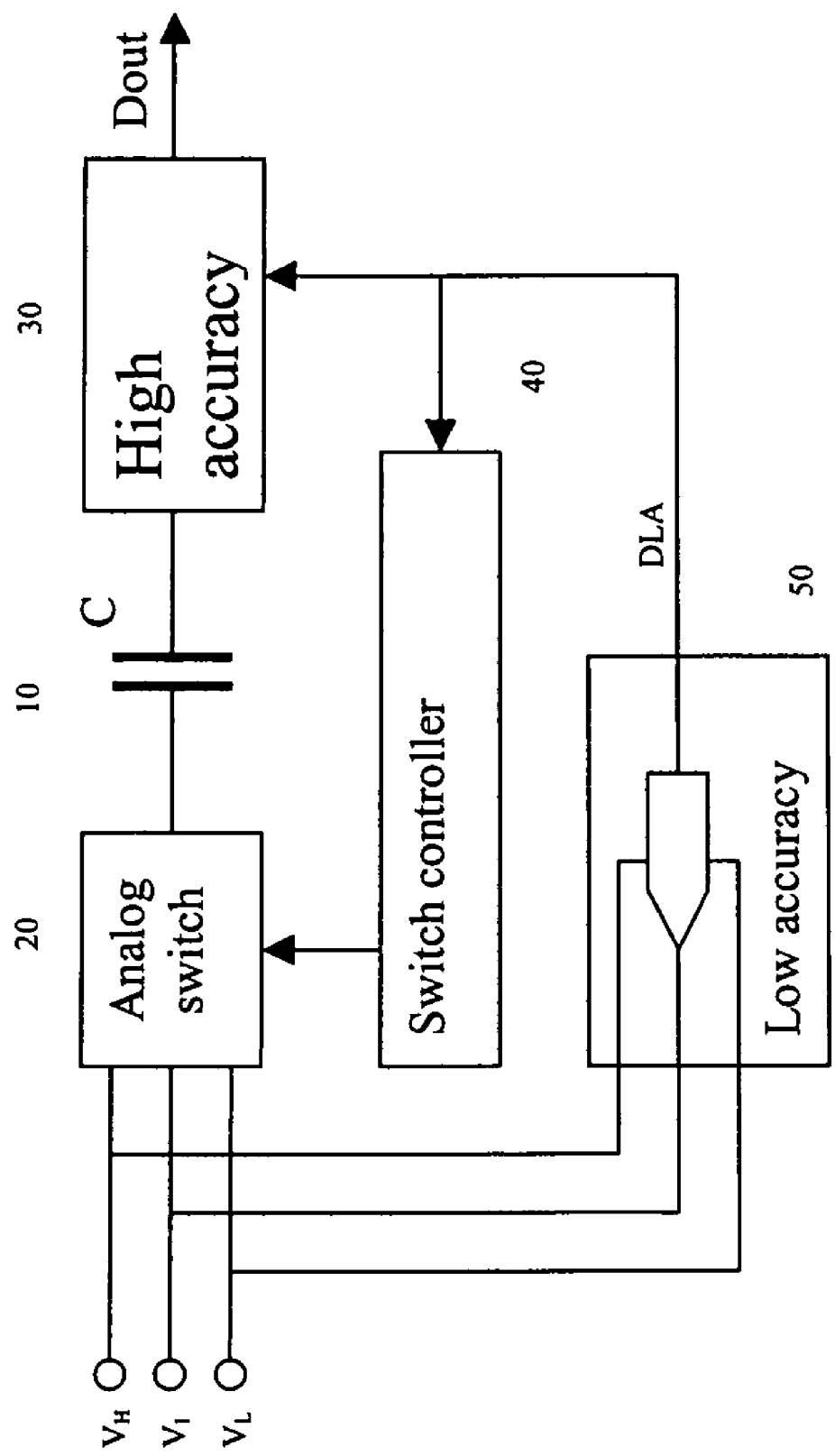
FIGS. 3A and 3B are diagrams illustrating A/D conversion arrangements of the present disclosure.

An immediate implementation of this proposal is shown in FIG. 3A. One terminal of the sampling capacitor #10 is connected to the input signal terminal $V_I$ and the reference signal terminals $V_H$ and $V_L$ through the analog switch block #20. The other terminal of the sampling capacitor #10 is connected to the "High accuracy converter" #30.

The magnitude of input signal $V_I$ is evaluated with respect to the reference signals $V_H$ and $V_L$ by the "Low accuracy ADC" #50. This converter can be implemented using a variety of well known analog-to-digital conversion techniques and, because of its relative low accuracy with respect to high-accuracy converter 30, it does not present a substantial load to the input signal $V_I$. The analog-to-digital converter #50, using the input signal $V_I$ and the reference signals $V_H$ and $V_L$ produces an equivalent digital representation DLA of input signal $V_I$. The digital signal DLA is a serial binary stream as described by equation (2) and has a resolution of N counts. Depending upon the conversion method used by the converter #50, this stream can be produced directly or converted from a parallel format through common digital techniques.

The DLA data stream is used by switch controller #40 to direct the operation of analog switch block #20. During each sample operation, the analog switch #20 connects the sampling capacitor #10 in two successive phases to one of the reference terminals $V_H$ and $V_L$ and to the input signal terminal $V_I$. Switch controller #40, using the information contained in the digital data stream DLA, selects the appropriate sampling sequence such that the total charge taken from the $V_I$ signal source during the conversion process is substantially zero.

The "High accuracy" converter #30 uses the charge sampled on capacitor #10 during a minimum of N successive sampling steps together with the sampling sequence information contained in the DLA data stream to produce the output data Dout. Dout is a high accuracy representation of the input signal $V_I$.

In the above description the "High accuracy" and "Low accuracy" are relative terms that relate directly to the different potential loadings of the input signal (corresponding to the larger capacitors required for higher accuracy resolution as described above) by the two converters. The terms "low accuracy" and "high accuracy" as defined herein are intended only to describe the relative relationship of the two analog-to-digital converters and are not intended to limit the scope of the invention, or of either of the converters, to any particular objective accuracy range.

The operation of converters #30 and #50 can be simultaneous and synchronized or converter #50 can produce its output at any time prior to the utilization of the output in the sampling process.

The implementation of analog-to-digital converters, sampling capacitors, analog switches and switch controllers is well known and widely described in the technical literature. The sampling capacitor, shown as a single device in FIG. 3A, may be in an actual implementation a set of capacitors which simultaneously perform the input and reference sampling operations required by the over-sampling converter as well as additional scaling and calibration functions. Similarly the analog switch may be implemented using multiple physical switches in various parallel and serial configurations supporting simultaneous sampling, scaling and calibration functions.

Furthermore a single "High accuracy" converter #30 may be connected to multiple sampling capacitors C and receive each of the respective corresponding data streams DLA where each capacitor and its corresponding "Low accuracy" converter producing the DLA samples a distinct input signal. The converter #30 preferably combines each of the multiple capacitors respective charges in the analog domain and produces Dout as a digital representation of the ratio of the multiple input signals.

An over-sampling converter can greatly benefit from this sampling configuration being able to perform simultaneous the function of both converter #50 and converter #30 of FIG. 3A. During the conversion process such a converter samples the input signal N times (where N is the over-sample ratio) and generates a stream of digital data which is subsequently processed in order to obtain the conversion result. This stream of digital data contains information about the ratio between the input signal and the reference signal and such information can be used to control the sampling sequences in order to substantially reduce the average charge taken from the input signal source.

Figure 3B:
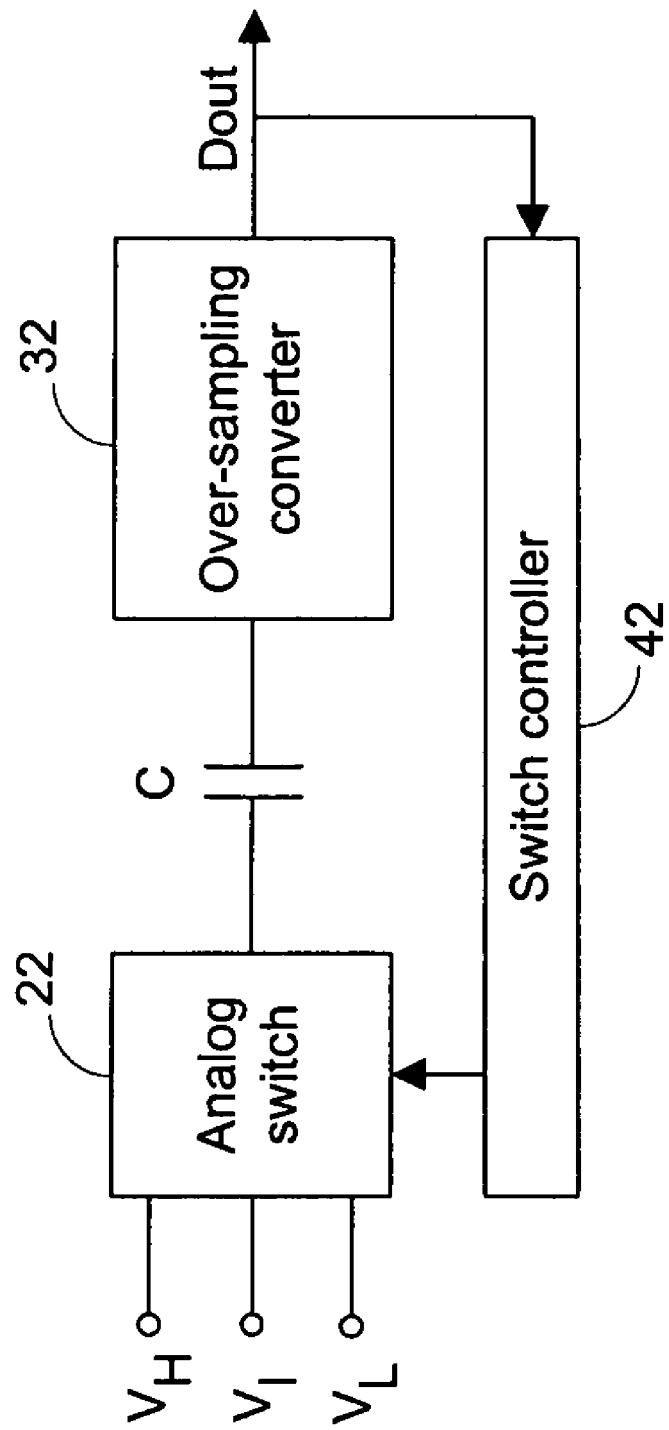

Another proposed configuration according to the invention is shown in FIG. 3B. FIG. 3B is a diagram illustrating components of an A/D converter 10 of the present disclosure that comprises an analog switch 22, a sampling capacitor C, an over-sampling converter 32 and a switch controller 42. The analog switch 22 connects one terminal of the sampling capacitor C to an input signal terminal $V_I$ and reference signal terminals $V_H$ and $V_L$. The other terminal of the sampling capacitor C is connected to the over-sampling converter 32.

A conversion cycle of the over-sampling converter 32 that produces an output data stream Dout consists of a set of N successive sample operations where N is the over-sampling ratio. The output data stream Dout, which is a digital representation of the ratio between the input signal and the reference signal, is supplied to the switch controller 42 to direct the operation of the analog switch 22. During each sample operation, the analog switch 22 connects the sampling capacitor C in two successive phases to one of the reference signal terminals $V_H$ and $V_L$ and to the input signal terminal $V_I$. The switch controller 42 uses the information contained in the digital data stream Dout to select the appropriate sampling sequence such that the total charge taken from the $V_I$ signal source is substantially zero.

One skilled in the art would realize that the analog switch 22, over-sampling converter 32, sampling capacitor C, and switch controller 42 may be implemented using various arrangements. For example, the sampling capacitor C may be represented by a set of capacitors which simultaneously perform the input and reference sampling operations required by the over-sampling converter as well as additional scaling and calibration functions. Similarly, the analog switch 22 may be implemented using multiple physical switches in various parallel and serial configurations supporting simultaneous sampling, scaling and calibration functions.

Figure 4:
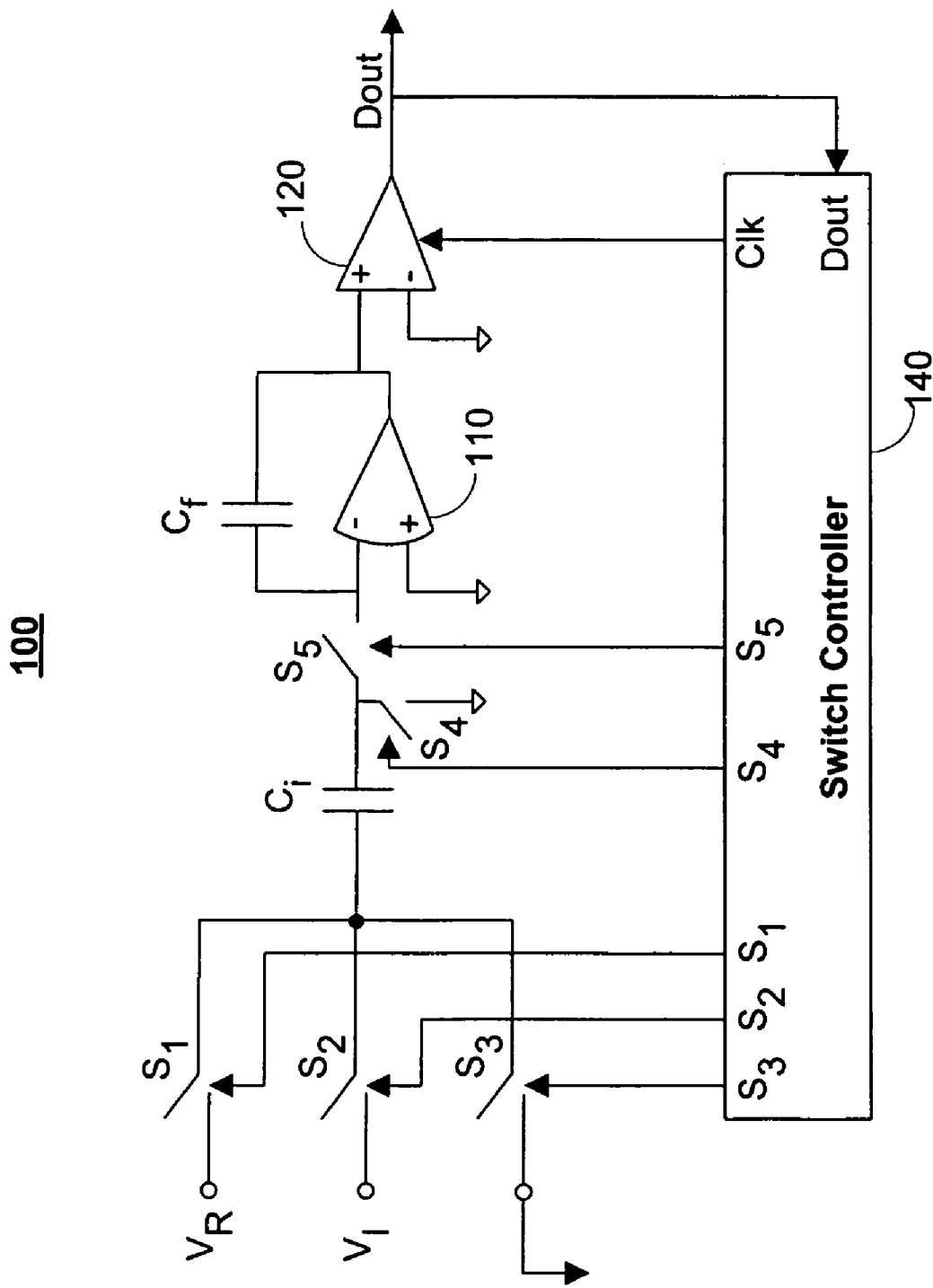
FIG. 4 is a diagram illustrating an embodiment of an A/D converter of the present disclosure.

An exemplary implementation of an A/D converter 100 of the present disclosure is shown in FIG. 4. The A/D converter 100 comprises a sampling capacitor $C_i$, a voltage amplifier 110 having an integrating capacitor $C_f$ in its feedback loop, a comparator 120, and a switch controller 140. An analog switch $S_I$ is provided for supplying a reference voltage $V_R$ to a first node of the sampling capacitor $C_i$. An analog switch $S_2$ is arranged for connecting an input voltage $V_I$ to the first node of the sampling capacitor $C_i$. For simplicity, a ground potential is selected as the second reference voltage ($V_L$=0). An analog switch $S_3$ connects this ground potential to the first node of the sampling capacitor $C_i$. Analog switches $S_4$ and $S_5$ are provided to connect a second node of the sampling capacitor $C_i$ to a ground node and the amplifier 110.

The integrating capacitor $C_f$, voltage amplifier 110, comparator 120 and analog switches $S_4$ and $S_5$ represent a first-order delta-sigma modulator. The amplifier 110, together with the capacitors Q and $C_f$, and the switches $S_4$ and $S_5$, represent a switched-capacitor implementation of an analog integrator. A ground potential is selected as common mode voltage references for the integrator and comparator circuits.

The output of the amplifier 110 is connected to the comparator 120 controlled by a clock signal Clk generated by an internal clock of the switch controller 140 to produce a single-bit output digital signal Dout. In particular, when the comparator 120 is triggered by the Clk signal, it produces output digital value Dout=1 if the output of the amplifier 110 is positive, and output value Dout=0 if the output of the amplifier 110 is negative.

The data signal Dout is used by the switch controller 140 to control operations of the first-order delta-sigma modulator. In particular, the switch controller 140 produces switch drive signals $S_1$ to $S_5$ for controlling the respective switches. Further, the data stream Dout may be processed by a digital filter (not shown) connected to the output of the comparator 120 to calculate the conversion result.

Based on the data signal Dout and an internal clock signal produced by the internal clock, the switch controller 140 controls the first-order delta-sigma modulator to maintain the total charge taken from the input signal source substantially zero for N consecutive sample operations of one conversion cycle.

Sampling operations of the A/D converter 100 performed during the AD conversion procedure are described below. Every pulse of the internal clock signal starts the following two-phase sampling operation sequence:

1. Trigger the voltage comparator 120 using the clock signal Clk.
2. Open switch $S_5$.
3. Open switch $S_2$.
4. Close switch $S_4$.
5. If Dout=0 close switch $S_3$, if Dout=1 close switch $S_1$.
6. Wait for settling of the first phase samples.
7. Open switch $S_4$,
8. Open switch $S_1$ and $S_3$.
9. Close switch $S_5$.
10. Close switch $S_2$.
11. Wait for settling of the second phase samples.

The time allocated for each one of the above steps may be determined in accordance with a particular switched capacitor implementation.

The amount of charge $Q_M$ transferred into the integrating capacitor $C_f$ during such a sampling sequence is:

when Dout=0, $Q_M = V_I * C_i$;

when Dout=1, $Q_M = (V_I - V_R) * C_i$.

The amount of charge dQ taken from the input signal source $V_I$ during such a sampling sequence is:

when Dout=0, $dQ=V_I*C_i$, when Dout=1, $dQ=(V_I-V_R)*C_i$.

It is assumed that among N consecutive sampling operations in a sampling process, for $N_1$ sampling operations Dout=1 and for $N_0=(N-N_1)$ sampling operations Dout=0. Hence, in each of $N_1$ sampling operations, the reference voltage $V_R$ is supplied together with the input voltage $V_I$, and in each of $N_0$ sampling operations, the reference voltage $V_1$ (set to a ground potential in this particular example) is supplied together with the input voltage $V_I$. Therefore, the total charge $Q_{MTOT}$ transferred into the integrating capacitor $C_f$ during the set of N consecutive sampling operations is:

$$Q_{MTOT}=N_0*V_I*C_i+N_1*(V_I-V_R)*C_i=(N-N_1)*V_I*C_i*(V_I-V_R)$$

$$Q_{MTOT}=(N*V_I-N_1*V_R)*C_i.$$

The delta-sigma modulator operates so as to minimize the total charge accumulated in the integrator. Hence, within the resolution of the modulator, if $Q_{MTOT}=0$, $N_1=N*V_I/V_R$.

Hence, the ration $N_1/N$ representing the density of "1" bits provides information on the ratio $V_I/V_R$ between the input signal and the reference signal. Therefore, the digital output data stream Dout provides this information to the switch controller 40.

Accordingly, the total charge taken from the input signal source can be calculated as:

$$dQ_{TOT}=N_0*V_I*C_i+N_1*(V_I-V_R)*C_i=(N*V_I-N_1*V_R)*Ci$$

and within the resolution of the converter if $N_1=N*V_I/V_R$, $dQ_{TOT}=0$

Therefore, to set the total charge taken from the input signal source during a sampling process to a substantially zero level, the switch controller 40 controls the switches $S_1$ to $S_3$ to set $N_1$ equal to $N* V_I/V_R$, i.e. to supply in each of $N_1$ sampling operations, the reference voltage $V_R$ together with the input voltage $V_I$, and to supply in each of $N-N_1$ sampling operations, the reference voltage $V_L$ (set to a ground potential) together with the input voltage $V_I$.

One skilled in the art would understand that the concept of the present disclosure is also applicable to higher-order modulators that may have additional integrator stages between the output of the amplifier 110 and the input of the comparator 120.

In addition, one skilled in the art would realize that the disclosed technique is not limited to over-sampling converters producing single-bit digital data streams. It may also be applicable to converters generating multi-bit output data streams. In this case, multi-bit output data streams may be converted into multiple single bit data streams such as binary weighted or thermometer encoded streams, which may be used to control multiple equivalent weighted input signal sampling capacitors.

Further, the disclosed sampling front-end configuration with reduced average input current may be integrated with other well known delta-sigma modulators, such as MASH or band-pass modulators.

As shown above, the sampling arrangement in FIG. 4 substantially reduces the differential charge taken from the input signals during a sampling process at a substantially zero level. However, source resistances present in two nodes of the input signal source may be unbalanced. For some practical applications, the remaining common mode current significantly influences the accuracy of an analog-to-digital conversion system.

The A/D conversion system 200 allows an average input current to be substantially reduced. The system 200 includes A/D converters 210 and 220 and a digital combining and filtering circuit 230. Each of the converters 210 and 220 operates in a manner discussed above in connection with FIG. 3 to reduce an average input current by providing a substantially zero charge taken from the input signal source. For example, each of the converters 210 and 220 may be implemented by the A/D conversion arrangement shown in FIG. 4.

The A/D conversion system 200 is supplied with two input signals through input nodes $V_{IP}$ and $V_{IN}$. To eliminate the input current, the converter 210 samples the input voltage $V_{IP}$ provided by the node $V_{IP}$, whereas the converter 220 samples the input voltage $V_{IN}$ provided by the node $V_{IN}$.

Further, the A/D conversion system 200 may be supplied with two reference signals through reference nodes $V_{RP}$ and $V_{RN}$. These reference signals are coupled to both converters 210 and 220.

The conversion system 200 evaluates the differential input value $V_I$ present between the two input signals $V_{IP}$ and $V_{IN}$ with respect to the differential reference value $V_R$ present between the two reference signals $V_{RP}$ and $V_{RN}$.

As shown in FIG. 4, each of the A/D converters 210 and 220 may include the sampling capacitor $C_i$, the voltage amplifier 110 having an integrating capacitor $C_f$ in its feedback loop, the comparator 120, and the switch controller 140. In each of the converters, the analog switch $S_1$ may supply the reference voltage $V_{RP}$ to the sampling capacitor $C_i$, and the analog switch $S_3$ may supply the sampling capacitor $C_i$ with reference voltage $V_{RN}$. Further, the analog switch $S_2$ may supply the sampling capacitor $C_i$ with the input voltage $V_{IP}$ in the converter 210, and with the input voltage $V_{IN}$ in the converter 220. The switches $S_4$ and $S_5$, together with the amplifier 110 and the capacitors $C_i$ and $C_f$, represent a switched-capacitor implementation of an analog integrator.

In the A/D converter 210, the switches $S_1$ to $S_5$ may be controlled by the switch controller 140 in a manner discussed above to sample the input voltage $V_{IP}$ with respect to the reference voltages $V_{RP}$, $V_{RN}$ so as to provide a substantially zero charge taken from the node $V_{IP}$. In a similar manner, the switches $S_1$ to $S_5$ of the A/D converter 220 may be switched to sample the input voltage $V_{IN}$ with respect to the reference voltages $V_{RP}$, $V_{RN}$ so as to provide a substantially zero charge taken from the node $V_{IN}$. As a result of the sampling, the A/D converter 210 may produce an output signal Doutp, and the A/D converter 220 may produce an output signal Doutn. For example, the signals Doutp and Doutn may be single-bit digital serial streams.

The digital output signals Doutp and Doutn are supplied to the digital combining and filtering circuit 230 that performs digital combining and filtering of the output signals in a manner appropriate for over-sampling A/D conversion technique. The digital combining and filtering circuit 230 produces a digital output signal Dout representing a logical combination of the signals Doutp and Doutn.

For example, the digital combining and filtering circuit 230 may be implemented using a digital counter incremented at every clock pulse when Doutp=1 and Doutn=0, and decremented at every clock pulse when Doutp=0 and Doutn=1. The digital counter does not change its count at clock pulses, when Doutp=Doutn=0 or Doutp=Doutn=1.

To enable the digital combining and filtering circuit 230 to evaluate the differential input signal so as to provide high common-mode rejection, the A/D converters 210 and 220, and the digital combining and filtering circuit 230 are synchronized using a common synchronization mechanism. For example, the A/D converters 210 and 220, and the digital combining and filtering circuit 230 may share a common clock generator supplying synchronization signals sync to each of these units. These synchronization signals may be utilized for generating clock signals Clk in the respective switch controllers 140 of the A/D converters 210 and 220, and for producing clock signals controlling the counter or another combining and filtering mechanism in the digital combining and filtering circuit 230.

The A/D conversion system 200 substantially reduces average input current for both $V_{IP}$ and $V_{IN}$ nodes of the input signal source. This results in reduced average differential-mode and common-mode input currents.

The sampling circuit discussed above reduces the total charge taken from the input signals during a sampling process at a substantially zero level. However, this sampling arrangement does not reduce the charges taken from terminals of the reference signals. For some practical applications, the current drawn from the reference nodes significantly influences the accuracy of an analog-to-digital conversion system.

Figure 6:
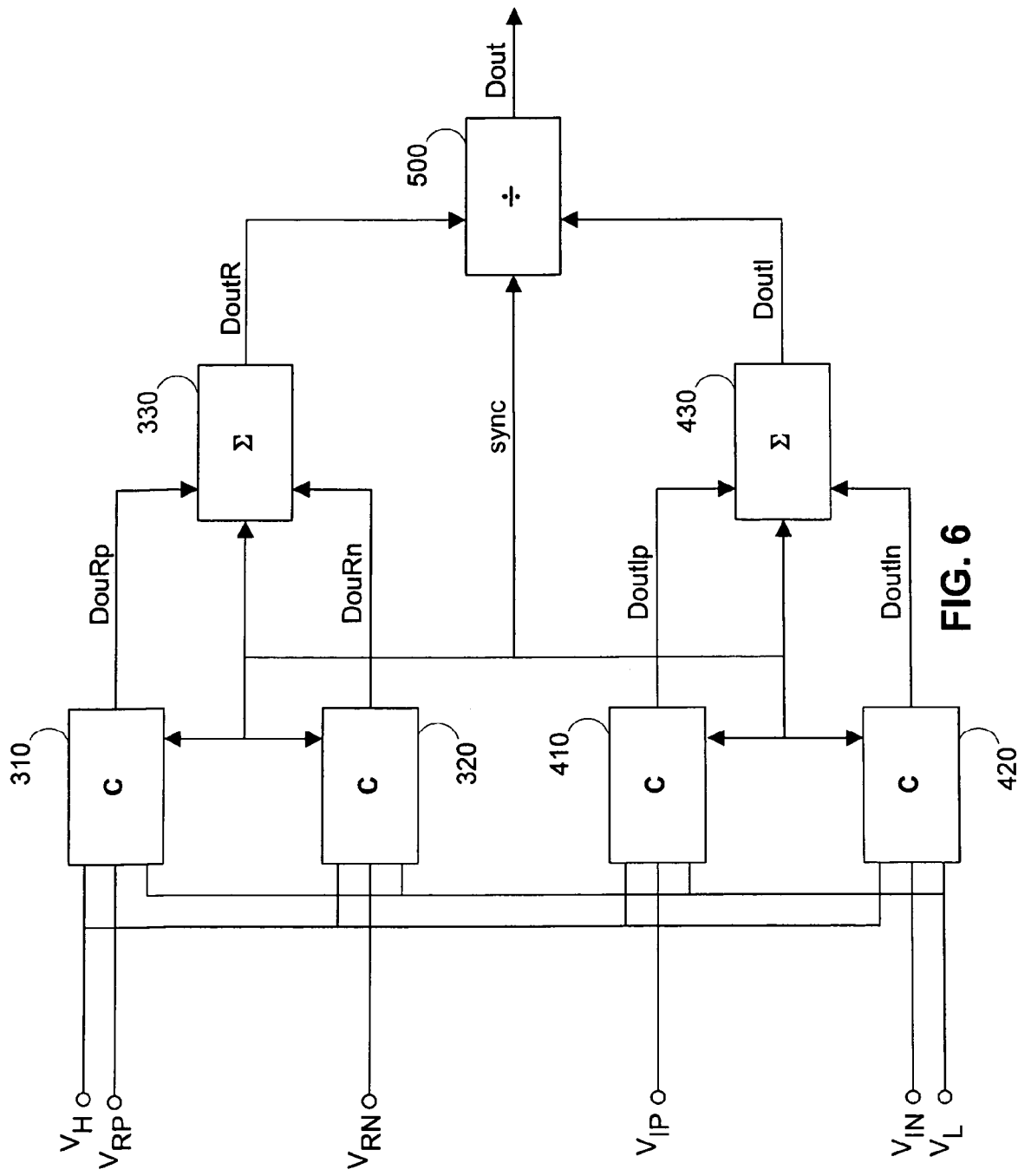
FIG. 6 is a diagram illustrating an A/D conversion system that maintains a substantially zero average current for both input signal and reference signal sources.

FIG. 6 shows a block-diagram of an A/D conversion system 300 that reduces to a substantially zero level the current drawn from all input signal nodes and all reference signal nodes. The A/D conversion system 300 comprises A/D converters 310, 320, 410 and 420, digital combining and filtering circuits 330 and 430 and a divider 500.

Each of the converters 310, 320, 410 and 420 operates in a manner discussed above in connection with FIG. 3 to reduce an average input current by providing a substantially zero charge taken from the respective signal source terminal. For example, each of the converters 310, 320, 410 and 420 may be implemented by the A/D conversion arrangement shown in FIG. 4.

The A/D conversion system 300 is supplied with two input signals through input notes $V_{IP}$ and $V_{IN}$. These input signals are coupled to the converters 410 and 420, respectively.

Further, the A/D conversion system 300 is supplied with two reference signals through reference nodes $V_{RP}$ and $V_{RN}$. These reference signals are coupled to the converters 310 and 320, respectively. For example, the reference signal $V_R$ may be a differential reference signal $V_{RP}$–$V_{RN}$.

The conversion system 300 evaluates the differential input value VI present between the two input signals VIP and VIN with respect to the differential reference value $V_R$ present between the two reference signals $V_{RP}$ and $V_{IN}$.

In addition, each of the converters 310, 320, 410 and 420 is supplied with local reference signals $V_H$ and $V_L$ that may be produced by local sources, whose parameters are not restricted by physical constrains such as constrains restricting parameters of external sensors. Sources of the local reference signals may be selected so as to provide current required by the converters 310, 320, 410 and 420 without any loss of A/D conversion accuracy.

Values of the local reference signals may be chosen so as to enable operation of the converter 310, 320, 410 and 420 over the entire expected range of the input levels $V_{IP}$ and $V_{IN}$, and the reference levels $V_{RP}$ and $V_{RN}$. For example, the level of the local reference signal $V_L$ may be not higher than the minimum level of any of the input signals $V_{IP}$ and $V_{IN}$, and reference signals $V_{RP}$ and $V_{RN}$; and the level of the local reference signal $V_H$ may be not lower than the maximum level of any of the input signals $V_{IP}$ and $V_{IN}$, and reference signals $V_{RP}$ and $V_{RN}$.

The converter 310 samples the reference signal $V_{RP}$ with respect to the local reference signals $V_H$ and $V_L$ so as to draw a substantially zero average current from the $V_{RP}$ terminal of the reference signal source. The converter 320 samples the reference signal $V_{RN}$ with respect to the local reference signals $V_H$ and $V_L$ so as to draw a substantially zero average current from the $V_{RN}$ terminal of the reference signal source. The converter 410 samples the input signal $V_{IP}$ with respect to the local reference signals $V_H$ and $V_L$ so as so as to draw a substantially zero average current from the $V_{IP}$ terminal of the input signal source. Finally, the converter 420 samples the input signal $V_{IN}$ with respect to the local reference signals $V_H$ and $V_L$ so as so as to draw a substantially zero average current from the $V_{IN}$ terminal of the input signal source.

As shown in FIG. 4, each of the A/D converters 310, 320, 410 and 420 may include the sampling capacitor $C_i$, the voltage amplifier 110 having an integrating capacitor $C_f$ in its feedback loop, the comparator 120, and the switch controller 140. In each of the converters, the analog switch $S_1$ may supply the local reference voltage $V_H$ to the sampling capacitor $C_i$, and the analog switch $S_3$ may supply the local reference voltage $V_L$ to the sampling capacitor $C_i$. Further, the analog switch $S_2$ may supply the sampling capacitor $C_i$ with the reference voltage $V_{RP}$ in the converter 310, with the reference voltage $V_{RN}$ in the converter 320, with the input voltage $V_{IP}$ in the converter 410, and with the input voltage $V_{IN}$ in the converter 420. The switches $S_4$ and $S_5$, together with the amplifier 110 and the capacitors $C_i$ and $C_f$, represent a switched-capacitor implementation of an analog integrator.

In the A/D converter 310, the switches $S_1$ to $S_5$ may be controlled by the switch controller 140 in a manner discussed above to sample the reference signal $V_{RP}$ with respect to the local reference signals $V_H$ and $V_L$ so as provide a substantially zero charge taken from the $V_{RP}$ terminal of the reference signal source. In a similar manner, the switches $S_1$ to $S_5$ of the converter 320 may be controlled to sample the reference signal $V_{RN}$ with respect to the local reference signals $V_H$ and $V_L$ so as provide a substantially zero charge taken from the $V_{RN}$ terminal of the reference signal source. Further, the switches $S_1$ to $S_5$ of the converter 410 may be controlled to sample the input signal $V_{IP}$ with respect to the local reference signals $V_H$ and $V_L$ so as provide a substantially zero charge taken from the $V_{IP}$ terminal of the input signal source. Finally, the switches $S_1$ to $S_5$ of the converter 420 may be controlled to sample the input signal $V_{IN}$ with respect to the local reference signals $V_H$ and $V_L$ so as provide a substantially zero charge taken from the $V_{IN}$ terminal of the input signal source.

As a result of the sampling, the converter 310 may produce an output signal DoutRp, the converter 320 may produce an output signal DoutRn, the converter 410 may produce an output signal DoutIp, and the converter 420 may produce an output signal DoutIn. For example, the signals DoutRp, DoutRn, DoutIp and DoutIn may be single-bit digital serial streams.

The digital output signals DoutRp and DoutRn are supplied to the digital combining and filtering circuit 330 that performs digital combining and filtering of the output signals in a manner appropriate for over-sampling A/D conversion technique to evaluate the differential reference signal $V_{RP}$–$V_{RN}$ with respect to the local reference signals $V_H$ and $V_L$. The digital output signals DoutIp and DoutIn are supplied to the digital combining and filtering circuit 430 that performs digital combining and filtering of the output signals in a similar manner to evaluate the differential input signal $V_{IP}$–$V_{IN}$ with respect to the local reference signals $V_H$ and $V_L$. The digital combining and filtering circuits 330 and 430 produce digital output signals DoutR and DoutI, respectively.

For example, the digital combining and filtering circuit 330 may be implemented using a digital counter incremented at every clock pulse when DoutRp=1 and DoutRn=0, and decremented at every clock pulse when DoutRp=0 and DoutRn=1. The digital counter does not change its count at clock pulses, when DoutRp=DoutRn=0 or DoutRp=DoutRn=1. The digital combining and filtering circuit 430 may be implemented using a digital counter incremented at every clock pulse when DoutIp=1 and DoutIn=0, and decremented at every clock pulse when DoutIp=0 and DoutIn=1. The digital counter does not change its count at clock pulses, when DoutIp=DoutIn=0 or DoutIp=DoutIn=1.

A digital divider circuit 500 may be used to process the data signals DoutR and DoutI and calculate the ratio between the differential input signal $V_{IP}$–$V_{IN}$ and the differential reference signal $V_{RP}$–$V_{RN}$. This ratio may represent the conversion result Dout.

To achieve high common-mode signal rejection, the A/D converters 310, 320, 330 and 340, the digital combining and filtering circuits 330 and 430, and the digital divider 500 are synchronized using a common synchronization mechanism. For example, the A/D converters 310, 320, 330 and 340, the digital combining and filtering circuits 330 and 430, and the digital divider 500 may share a common clock generator supplying synchronization signals sync to each of these units. These synchronization signals may be utilized for generating clock signals Clk in the respective switch controllers 140 of the A/D converters 310, 320, 410 and 420 and for producing clock signals controlling the counter or another combining and filtering mechanism in the digital combining and filtering circuits 330 and 430.

Figure 5:
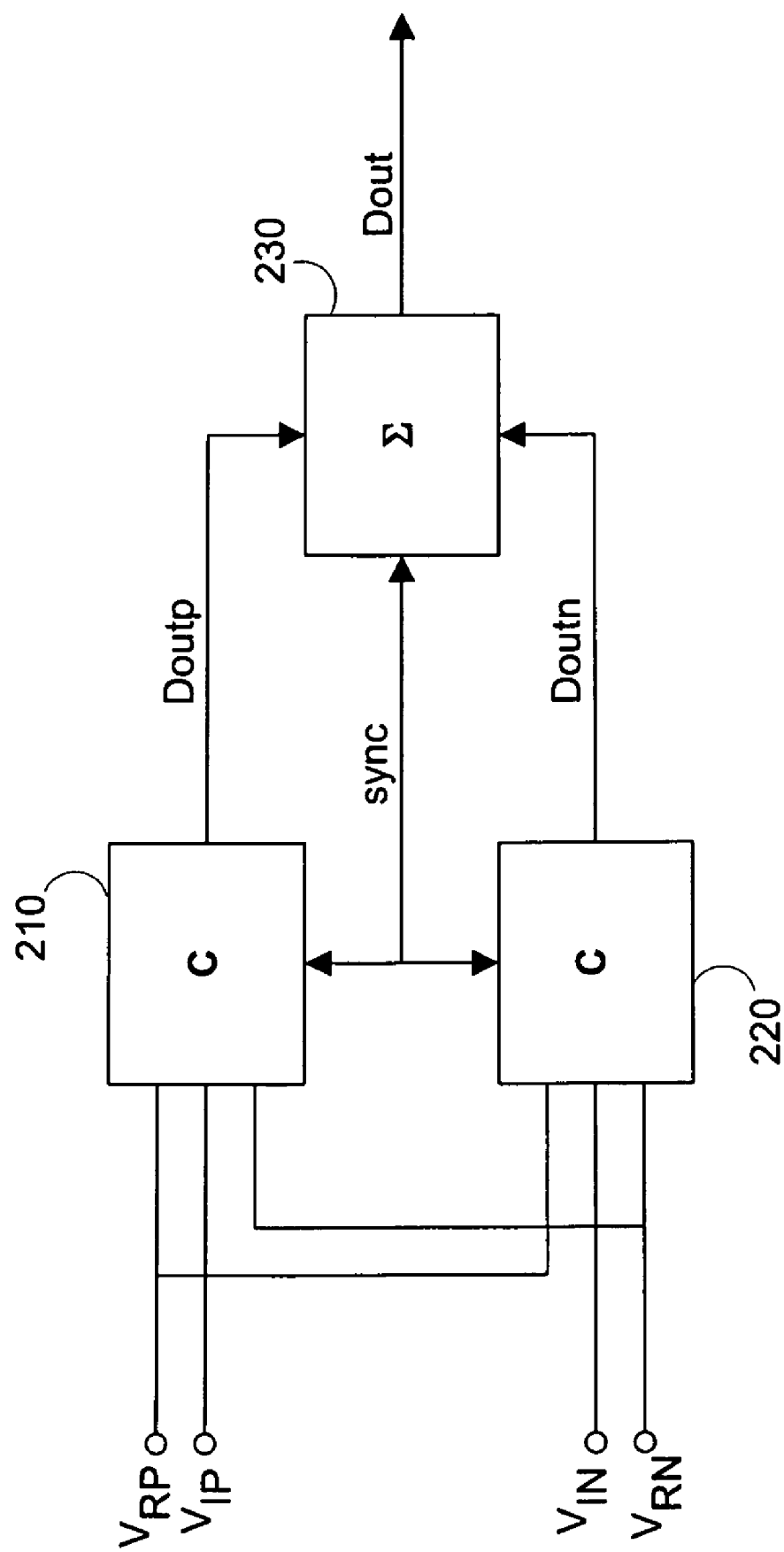
FIG. 5 is a diagram illustrating a sampling system that reduces an average input current.

Hence, the A/D conversion configuration shown in FIG. 5 maintains a near zero average current for both input signal source terminals $V_{IP}$ and $V_{IN}$, and both reference signal source terminals $V_{RP}$ and $V_{RN}$, providing a high overall A/D conversion accuracy for a very wide range of source resistance values driving these terminals.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A method of converting a differential analog input signal into a digital output signal, the differential analog input signal comprising the differential between a first analog input signal and a second analog input signal, the method comprising:
   obtaining a binary output from a first sampling device, the binary output that corresponds to the first analog input signal;
   if the binary output from the first sampling device is zero, then:
      sampling one of the first analog input signal and a first reference signal; and
      then sampling the other of the analog signal and the first reference signal;
   if the binary output from the first sampling device is a one, then:
      sampling one of the first analog signal and a second reference signal; and
      then sampling the other of the analog signal and the second reference signal;
   obtaining a binary output from a second sampling device, the binary output that corresponds to the second analog input signal;
   if the binary output from the second sampling device is a zero, then:
      sampling one of the second analog input signal and the first reference signal; and
      then sampling the other of the analog signal and the first reference signal;
   if the binary output from the second sampling device is a one, then:
      sampling one of the first analog signal and the second reference signal; and
      then sampling the other of the analog signal and the second reference signal;
   wherein each of the first sampling device and the second sampling device draws substantially zero average current from a first analog input source and a second analog input source, respectively;
   converting the first analog input signal to a first digital signal based on the sampling of the first sampling device;
   converting the second analog input signal to a second digital signal based on the sampling of the second sampling device; and
   combining the first digital signal and the second digital signal using a digital combiner to obtain the digital output signal.

2. The method of claim 1, further comprising synchronizing the operation of the first sampling circuit, the second sampling circuit and the digital combiner.

3. The method of claim 2, further comprising synchronizing by sharing a common clock generator between the first sampling circuit, the second sampling circuit, and the digital combiner.

4. The method of claim 1 further comprising filtering the digital output signal using a digital filter to obtain a filtered digital output signal.

5. A method of converting a differential analog input signal, the differential analog input signal comprising the differential between a first analog input signal and a second analog input signal, to a high-accuracy digital signal, the method comprising:
   sampling the first analog input signal, a first reference signal, and a second reference signal, the sampling using a first low accuracy analog-to-digital converter, the sampling that is used to provide a first low accuracy digital signal, the first analog signal having a magnitude greater than or equal to a magnitude of the first reference signal and less than or equal to a magnitude of the second reference signal;

using the first low accuracy digital signal to implement in a first high accuracy analog-to-digital converter a first switching sequence that controls a sampling of the first analog input signal and an analog-to-digital conversion of the first analog signal by the first high accuracy analog-to-digital converter to produce a first high accuracy digital signal;

sampling the second analog input signal, the first reference signal, and the second reference signal, the sampling using a second low accuracy analog-to-digital converter, the sampling that is used to provide a second low accuracy digital signal, the second analog signal having a magnitude greater than or equal to a magnitude of the first reference signal and less than or equal to a magnitude of the second reference signal;

using the second low accuracy digital signal to implement in a second high accuracy analog-to-digital converter a second switching sequence that controls a sampling of the second analog input signal and an analog-to-digital conversion of the second analog input signal by the second high accuracy analog-to-digital converter to produce the second high accuracy digital signal;

wherein each of the first high accuracy sampling device and the second high accuracy sampling device draws substantially zero average current from a first analog input source and a second analog input source that provides the first analog input signal and the second analog input signal, respectively;

combining the first high accuracy digital signal and the second high accuracy digital signal using a digital combiner to obtain the digital output signal.

6. The method of claim 5, further comprising using a delta-sigma modulator as the first low accuracy analog-to-digital converter, the delta-sigma modulator comprising a sampling capacitor coupled to perform the sampling operation, an integrating capacitor coupled to receive a sampled signal from the sampling capacitor, a voltage amplifier coupled to the capacitor, a comparator adapted to receive the output of the amplifier, and a plurality of analog switches that regulate operation of the delta-sigma modulator.

7. The method of claim 5, further comprising using a delta-sigma modulator as the first high accuracy analog-to-digital converter, the delta-sigma modulator comprising a sampling capacitor coupled to perform the sampling operation, an integrating capacitor coupled to receive a sampled signal from the sampling capacitor, a voltage amplifier coupled to the capacitor, a comparator adapted to receive the output of the amplifier, and a plurality of analog switches that regulate operation of the delta-sigma modulator.

8. The method of claim 5, further comprising using a delta-sigma modulator as the second low accuracy analog-to-digital converter, the delta-sigma modulator comprising an integrating capacitor, a voltage amplifier coupled to the capacitor, a comparator adapted to receive the output of the amplifier, and a plurality of analog switches that regulate operation of the delta-sigma modulator.

9. The method of claim 5, further comprising using a delta-sigma modulator as the second high accuracy analog-to-digital converter, the delta-sigma modulator comprising an integrating capacitor, a voltage amplifier coupled to the capacitor, a comparator adapted to receive the output of the amplifier, and a plurality of analog switches that regulate operation of the delta-sigma modulator.

10. The method of claim 5, further comprising using the first high-accuracy digital signal and the second high-accuracy digital signal to form a multi-bit digital output signal.

11. The method of claim 5 further comprising filtering the digital output signal using a digital filter to obtain a filtered digital output signal.

12. A system that converts a differential analog input signal, the differential analog input signal comprising the differential between a first analog input signal and a second analog input signal, to a high-accuracy digital signal, the system comprising:

a first low accuracy analog-to-digital converter that samples the first analog input signal, a first reference signal, and a second reference signal, the sampling that is used to provide a first low accuracy digital signal, the first analog signal having a magnitude greater than or equal to a magnitude of the first reference signal and less than or equal to a magnitude of the second reference signal;

a first high accuracy analog-to-digital converter that uses the first low accuracy digital signal to implement a first switching sequence, the first switching sequence that controls a sampling of the first analog input signal, the first reference signal and the second reference signal, and that controls an analog-to-digital conversion of the first analog signal by the first high accuracy analog-to-digital converter to produce a first high accuracy digital signal;

a second low accuracy analog-to-digital converter that samples the second analog input signal, the first reference signal, and the second reference signal, the sampling that is used to provide a second low accuracy digital signal, the second analog signal having a magnitude greater than or equal to a magnitude of the first reference signal and less than or equal to a magnitude of the second reference signal;

a second high accuracy analog-to-digital converter that uses the second low accuracy digital signal to implement a second switching sequence, the second switching sequence that controls a sampling of the second analog input signal, the first reference signal and the second reference signal, and that controls an analog-to-digital conversion of the second analog signal by the second high accuracy analog-to-digital converter to produce a second high accuracy digital signal;

wherein each of the first high accuracy sampling device and the second high accuracy sampling device draws substantially zero average current from a first analog input source and a second analog input source that provides the first analog input signal and the second analog input signal, respectively; and a digital combiner that combines the first high accuracy digital signal and the second high accuracy digital signal to obtain a combined digital signal.

13. The system of claim 12, the first low accuracy analog-to-digital converter comprising a delta-sigma modulator, the delta-sigma modulator comprising an integrating capacitor, a voltage amplifier coupled to the capacitor, a comparator adapted to receive the output of the amplifier, and a plurality of analog switches that regulate operation of the delta-sigma modulator.

14. The system of claim 12, the second low accuracy analog-to-digital converter comprising a delta-sigma modulator, the delta-sigma modulator comprising an integrating capacitor, a voltage amplifier coupled to the capacitor, a comparator adapted to receive the output of the amplifier, and a plurality of analog switches that regulate operation of the delta-sigma modulator.

15. The system of claim 12, the first high accuracy analog-to-digital converter comprising a delta-sigma modulator, the delta-sigma modulator comprising an integrating capacitor, a voltage amplifier coupled to the capacitor, a comparator adapted to receive the output of the amplifier, and a plurality of analog switches that regulate operation of the delta-sigma modulator.

16. The system of claim 12, the second high accuracy analog-to-digital converter comprising a delta-sigma modulator, the delta-sigma modulator comprising an integrating capacitor, a voltage amplifier coupled to the capacitor, a comparator adapted to receive the output of the amplifier, and a plurality of analog switches that regulate operation of the delta-sigma modulator.

17. The system of claim 12, the digital output signal comprising a multi-bit differential digital signal.

18. The system of claim 12 further comprising a digital filter that filters the digital output signal to obtain a filtered digital output signal.

19. A analog-to-digital converter that converts a differential analog input signal into a digital output signal, the differential analog input signal comprising the differential between a first analog input signal and a second analog input signal, the converter comprising:
  the differential analog input signal;
  a plurality of reference signals;
  a binary output from the analog-to-digital converter, the binary output that corresponds to the first analog input signal;
  a first sampling device;
  a second sampling device; and
  wherein if the binary output is a zero, then:
    using the first sampling device to sample one of the first analog input signal and a first reference signal; and
    using the first sampling device to sample the other of the analog signal and the first reference signal;
  if the binary output from the sampling device is a one, then:
    using the second sampling device to sample one of the first analog signal and a second reference signal; and
    then using the second sampling device to sample the other of the analog signal and the second reference signal;
  obtaining a binary output from a second sampling device, the binary output that corresponds to the second analog input signal;
  if the binary output from the second sampling device is a zero, then:
    sampling one of the second analog input signal and the first reference signal; and
    then sampling the other of the analog signal and the first reference signal;
  if the binary output from the second sampling device is a one, then:
    using the second sampling device to sample one of the first analog signal and the second reference signal; and
    then using the sampling device to sample the other of the analog signal and the second reference signal;
  wherein each of the first sampling device and the second sampling device draws substantially zero average current from a first analog input source and a second analog input source, respectively;
  an first intermediate analog-to-digital converter that converts the first analog input signal to a first digital signal based on the sampling of the first sampling device;
  a second intermediate analog-to-digital converter that converts the second analog input signal to a second digital signal based on the sampling of the second sampling device; and
  a digital combiner that combines the first digital signal and the second digital signal to obtain the digital output signal.

20. The method of claim 19, wherein the operation of the first sampling circuit, the second sampling circuit and the digital combiner is synchronized.

21. The method of claim 20, further comprising a common clock generator that synchronizes the operation of the first sampling circuit, the second sampling circuit, and the digital combiner.

22. The method of claim 19 further comprising a digital filter that filters the digital output signal to obtain a filtered digital output signal.

23. A method of converting a differential input signal and a differential reference signal into a digital output signal, the differential input signal comprising the differential between a first input signal and a second input signal, the differential reference signal comprising the differential between a first reference signal and a second reference signal:
  obtaining a binary output from a first sampling device, the binary output that corresponds to the first input signal;
  if the binary output from the first sampling device is zero, then:
    sampling one of the first input signal and a first local signal; and
    then sampling the other of the first input signal and the first local signal;
  if the binary output from the first sampling device is a one, then:
    sampling one of the first input signal and a second local signal; and
    then sampling the other of the first input signal and the second local signal;
  obtaining a binary output from a second sampling device, the binary output that corresponds to the second input signal;
  if the binary output from the second sampling device is a zero, then:
    sampling one of the second input signal and the first local signal; and
    then sampling the other of the second input signal and the first local signal;
  if the binary output from the second sampling device is a one, then:
    sampling one of the second input signal and the second local signal; and
    then sampling the other of the second input signal and the second local signal;
  wherein each of the first sampling device and the second sampling device draws substantially zero average current from a first input source and a second input source, respectively;
  converting the first input signal to a first digital signal based on the sampling of the first sampling device;
  converting the second input signal to a second digital signal based on the sampling of the second sampling device;

combining the first digital signal and the second digital signal using a first digital combiner to obtain a first intermediate combined digital output signal;

obtaining a binary output from a third sampling device, the binary output that corresponds to the first reference signal;

if the binary output from the third sampling device is zero, then:
sampling one of the first reference signal and a first local signal; and
then sampling the other of the first reference signal and the first local signal;

if the binary output from the third sampling device is a one, then:
sampling one of the first reference signal and a second local signal; and
then sampling the other of the first reference signal and the second local signal;

obtaining a binary output from a fourth sampling device, the binary output that corresponds to the second reference signal;

if the binary output from the fourth sampling device is a zero, then:
sampling one of the second reference signal and the first local signal; and
then sampling the other of the second reference signal and the first local signal;

if the binary output from the fourth sampling device is a one, then:
sampling one of the second reference signal and the second local signal; and
then sampling the other of the second reference signal and the second local signal;

wherein each of the third sampling device and the fourth sampling device draws substantially zero average current from a first reference source and a second reference source, respectively;

converting the first reference signal to a third digital signal based on the sampling of the third sampling device;

converting the second reference signal to a fourth digital signal based on the sampling of the fourth sampling device;

combining the third digital signal and the fourth digital signal using a second digital combiner to obtain a second intermediate combined digital output signal; and combining the first intermediate combined digital output signal and the second intermediate combined digital output signal using a third digital combiner to obtain the digital output signal.

24. The method of claim 23, further comprising synchronizing the operation of the first sampling circuit, the second sampling circuit, the third sampling circuit, the fourth sampling circuit, the first digital combiner, the second digital combiner, and the third digital combiner.

25. The method of claim 24, further comprising synchronizing by sharing a common clock generator between the first sampling circuit, the second sampling circuit, the third sampling circuit, the fourth sampling circuit, the first digital combiner, the second digital combiner, and the third digital combiner.

26. The method of claim 23 further comprising filtering the digital output signal using a digital filter to obtain a filtered digital output signal.

27. The method of claim 23 wherein the third digital combiner comprises a digital divider.

28. An analog-to-digital converter that converts a differential input signal and a differential reference signal into a digital output signal, the differential input signal comprising the differential between a first input signal and a second input signal, the differential reference signal comprising the differential between a first reference signal and a second reference signal, the converter comprising:

a first sampling device that is used to provide a binary output, the binary output that corresponds to the first input signal;

if the binary output from the first sampling device is zero, then:
sampling one of the first input signal and a first local signal; and
then sampling the other of the first input signal and the first local signal;

if the binary output from the first sampling device is a one, then:
sampling one of the first input signal and a second local signal; and
then sampling the other of the first input signal and the second local signal;

a second sampling device that is used to provide a binary output, the binary output that corresponds to the second input signal;

if the binary output from the second sampling device is a zero, then:
sampling one of the second input signal and the first local signal; and
then sampling the other of the second input signal and the first local signal;

if the binary output from the second sampling device is a one, then:
sampling one of the second input signal and the second local signal; and
then sampling the other of the second input signal and the second local signal;

wherein each of the first sampling device and the second sampling device draws substantially zero average current from a first input source and a second input source, respectively;

wherein the analog-to-digital converter is adapted to convert the first input signal to a first digital signal based on the sampling of the first sampling device;

wherein the analog-to-digital converter is adapted to convert the second input signal to a second digital signal based on the sampling of the second sampling device;

a first digital combiner that combines the first digital signal and the second digital signal to obtain a first intermediate combined digital output signal;

a third sampling device that is used to provide a binary output, the binary output that corresponds to the first reference signal;

if the binary output from the third sampling device is zero, then:
sampling one of the first reference signal and a first local signal; and
then sampling the other of the first reference signal and the first local signal;

if the binary output from the third sampling device is a one, then:
sampling one of the first reference signal and a second local signal; and
then sampling the other of the first reference signal and the second local signal;

a third sampling device that is used to provide a binary output, the binary output that corresponds to the second reference signal;
if the binary output from the fourth sampling device is a zero, then:
  sampling one of the second reference signal and the first local signal; and
  then sampling the other of the second reference signal and the first local signal;
if the binary output from the fourth sampling device is a one, then:
  sampling one of the second reference signal and the second local signal; and
  then sampling the other of the second reference signal and the second local signal;
wherein each of the third sampling device and the fourth sampling device draws substantially zero average current from a first reference source and a second reference source, respectively;
wherein the analog-to-digital converter is adapted to convert the first reference signal to a third digital signal based on the sampling of the third sampling device;
wherein the analog-to-digital converter is adapted to convert the second reference signal to a fourth digital signal based on the sampling of the fourth sampling device;

a second digital combiner that combines the third digital signal and the fourth digital signal to obtain a second intermediate combined digital output signal; and a third digital combiner that combines the first intermediate combined digital output signal and the second intermediate combined digital output signal to obtain the digital output signal.

29. The converter of claim 28, wherein the operation of the first sampling circuit, the second sampling circuit, the third sampling circuit, the fourth sampling circuit, the first digital combiner, the second digital combiner, and the third digital combiner is synchronized.

30. The converter of claim 29, further comprising a common clock generator that synchronizes the operation of the first sampling circuit, the second sampling circuit, the third sampling circuit, the fourth sampling circuit, the first digital combiner, the second digital combiner, and the third digital combiner.

31. The converter of claim 28 further comprises a digital filter that filters the digital output signal to obtain a filtered digital output signal.

32. The converter of claim 28 wherein the third digital combiner comprises a digital divider.

* * * * *